United States Patent [19]

Akaogi

[11] Patent Number: 5,293,344
[45] Date of Patent: Mar. 8, 1994

[54] WRITE CIRCUIT FOR NON-VOLATILE MEMORY DEVICE

[75] Inventor: Takao Akaogi, Inagi, Japan

[73] Assignee: Fujitsu Limited, Kawasaki, Japan

[21] Appl. No.: 656,502

[22] Filed: Feb. 19, 1991

[30] Foreign Application Priority Data

Feb. 19, 1990 [JP] Japan .................................. 2-37581

[51] Int. Cl.⁵ ...................... G11C 7/00; G11C 11/40
[52] U.S. Cl. ................................... 365/210; 365/185
[58] Field of Search .................. 365/189.01, 200, 207, 365/209, 210, 185

[56] References Cited

U.S. PATENT DOCUMENTS

| 4,677,590 | 6/1987 | Arakawa | 365/210 X |
| 4,954,990 | 9/1990 | Vider | 365/185 |

FOREIGN PATENT DOCUMENTS

| 0171718 | 2/1986 | European Pat. Off. | |
| 0225441 | 6/1987 | European Pat. Off. | |
| 0345791 | 12/1989 | European Pat. Off. | |
| 0108764 | 6/1983 | Japan | 365/210 |
| 0029497 | 2/1986 | Japan | 365/210 |

OTHER PUBLICATIONS

Hoff et al., "A 23-ns 256K EPROM with Double-Layer Metal and Address Transition Detection," *IEEE Journal of Solid-State Circuits*, vol. 24, No. 5, Oct. 1989, pp. 1250-1258.

*Primary Examiner*—Steven Mottola
*Attorney, Agent, or Firm*—Staas & Halsey

[57] ABSTRACT

A write circuit for a non-volatile memory device includes a plurality of cell transistors and a bit line select transistor, provided with respect to each bit line, for supplying a source current thereof to one of the cell transistors as a drain current of the cell transistor via a corresponding one of the bit lines. The write circuit includes a dummy cell transistor for detecting a breakdown voltage of the cell transistor in a write mode, and a circuit for varying a gate voltage of the bit line select transistor as a function of the breakdown voltage detected by the dummy cell transistor, thereby to make the gate-source voltage of the bit line select transistor approximately constant and to maintain the drain current of the cell transistor during the write mode approximately constant.

15 Claims, 4 Drawing Sheets

WRITE CIRCUIT FOR NON-VOLATILE MEMORY DEVICE

BACKGROUND OF THE INVENTION

The present invention generally relates to write circuits, and more particularly to a write circuit for a non-volatile memory device which writes information by causing an avalanche breakdown of a cell transistor.

In a non-volatile memory device such as an erasable programmable read only memory (EPROM), data is written by applying a high voltage to the control gate and the drain of a transistor which forms a memory cell. The write efficiency of such a write operation is dependent on the drain voltage, and it is necessary to maintain the drain voltage at an appropriate value.

FIG. 1 shows an example of a conventional write circuit together with related parts of the EPROM. In FIG. 1 and figures which follow, a depletion type MOS transistor is indicated with a dot beside its drain.

In FIG. 1, depletion type MOS transistors Q1 and Q2 are used for supplying a power source voltage to a column decoder, transistors Q3 and Q4 form an inverter within the column decoder, a transistor Q5 is used for supplying a power source voltage for programming (writing), a transistor Q6 is used for bit line selection, and a transistor Q7 forms a EPROM cell.

When programming the EPROM, an output signal of a NAND circuit 10 has a low level in response to a column address, and a high voltage Vpp of 12.5 V is applied to the gate of the cell transistor Q7, that is, through a word line WL. In addition, a program signal PGM has a high level and an inverted program signal $\overline{PGM}$ has a low level, and the voltage Vpp is supplied to the column decoder as the power source voltage. Accordingly, the voltage Vpp is supplied to both the gate and the drain of the cell transistor Q7, and a write operation is carried out.

A characteristic I indicated by a solid line I in FIG. 2 shows a breakdown characteristic of the cell transistor Q7 described by a drain current $I_D$ and a drain voltage $V_D$. On the other hand, a characteristic II indicated by a solid line shows a drain current $I_D$ versus drain voltage VD characteristic (that is, a load curve) of the select transistor Q6. The write operation is carried out with respect to the cell transistor Q7 at an intersection point A between the two characteristics I and II.

However, if the gate length of the cell transistor Q7 is shorter than a designed value, due to inconsistencies introduced from inevitable production error, the breakdown characteristic of the cell transistor Q7 changes as indicated by a dotted line III in FIG. 2, and in this case, the write operation with respect to the cell transistor Q7 is carried out at an intersection point B between the characteristics II and III. In this case, the breakdown of the cell transistor Q7 occurs in a tunnel region and not in an avalanche region. Because the electron energy is small in the tunnel region, the electrons do not penetrate the oxide layer barrier thereby to accumulate a charge in the floating gate of the cell transistor Q7, and thus, there is a problem in that the write efficiency becomes poor. In addition, when the drain current $I_D$ becomes large, there is a problem in that the transistors Q6 and Q7 may break down.

SUMMARY OF THE INVENTION

Accordingly, it is a general object of the present invention to provide a novel and useful write circuit in which the problems described above are eliminated.

Another and more specific object of the present invention is to provide a write circuit for a non-volatile memory device including a plurality of cell transistors each of which is connected to a corresponding one of a plurality of word lines and to a corresponding one of a plurality of bit lines, and a bit line select transistor provided with respect to each bit line for supplying a source current thereof to one of the cell transistors as a drain current of the cell transistor via a corresponding one of the bit lines, wherein the write circuit comprises a dummy cell transistor for detecting a breakdown voltage of the cell transistor in a write mode, and circuit means coupled to the dummy cell transistor and responsive to a write mode signal which is indicative of the write mode for varying a gate voltage of the bit line select transistor, depending on the breakdown voltage detected by the dummy cell transistor, to make a gate-source voltage of the bit line select transistor approximately constant, so that the drain current of the cell transistor during the write mode becomes approximately constant. According to the write circuit of the present invention, it is possible to improve the write efficiency of the non-volatile memory device. In addition, it is possible to prevent the cell transistor, the bit line select transistor, and the like, from breaking down due to an excessively large current.

Other objects and further features of the present invention will be apparent from the following detailed description when read in conjunction with the accompanying drawings.

DESCRIPTION OF THE PREFERRED EMBODIMENTS

Figure 3:
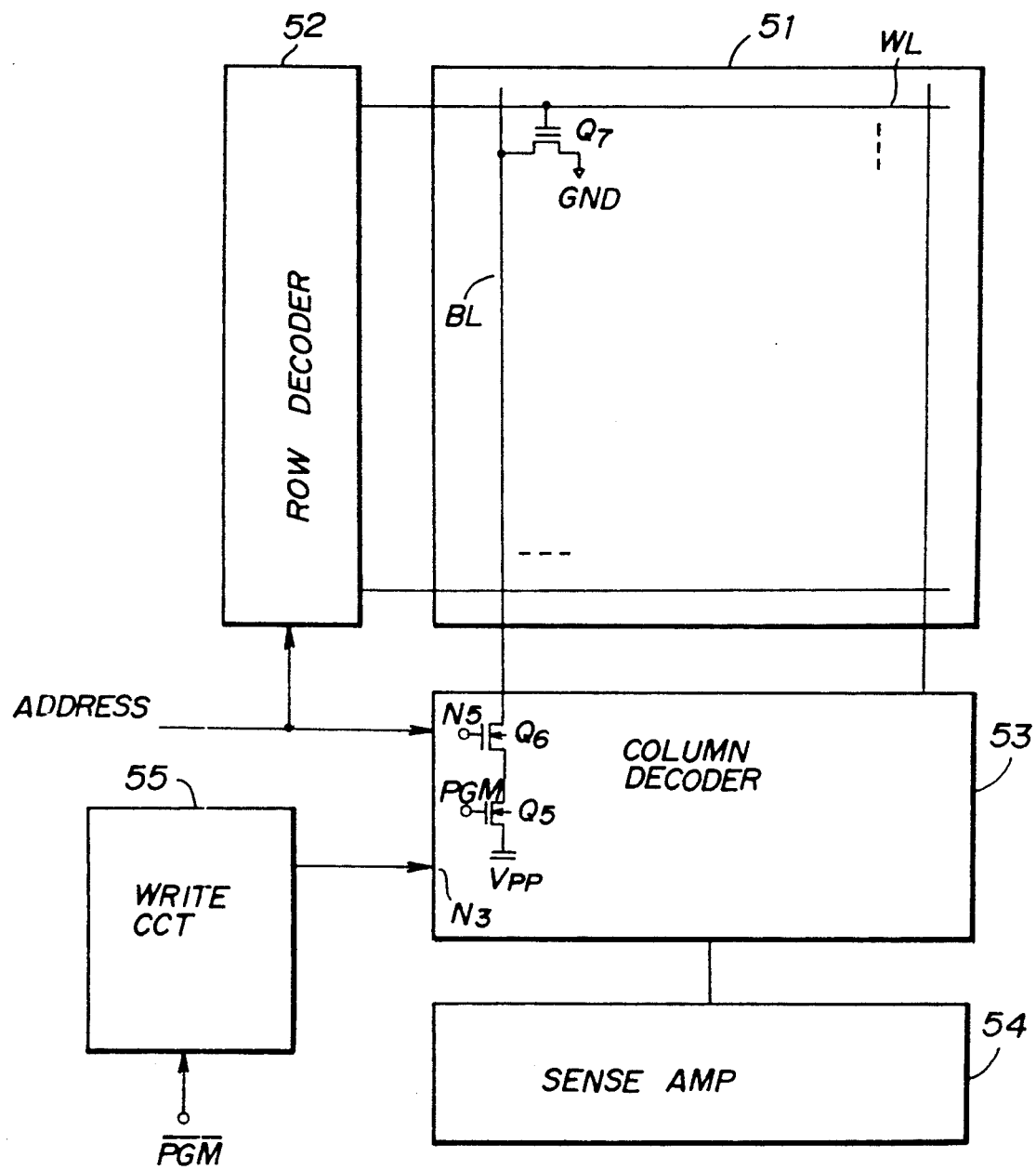
FIG. 3 is a system block diagram showing an EPROM to which a write circuit according to the present invention may be applied.

FIG. 3 shows a non-volatile memory device to which a write circuit according to the present invention may be applied. FIG. 3 shows an EPROM generally including a memory cell array 51, a row decoder 52, a column decoder 53, a sense amplifier 54 and a write circuit 55. A plurality of memory cells are arranged in a matrix arrangement within the memory cell array 51, and each memory cell is connected to one of a plurality of word lines WL and to one of a plurality of bit lines BL. The row decoder 52 selects one of the word lines WL in response to an address signal, and the column decoder selects one of the bit lines BL in response to the address signal.

Figure 1:
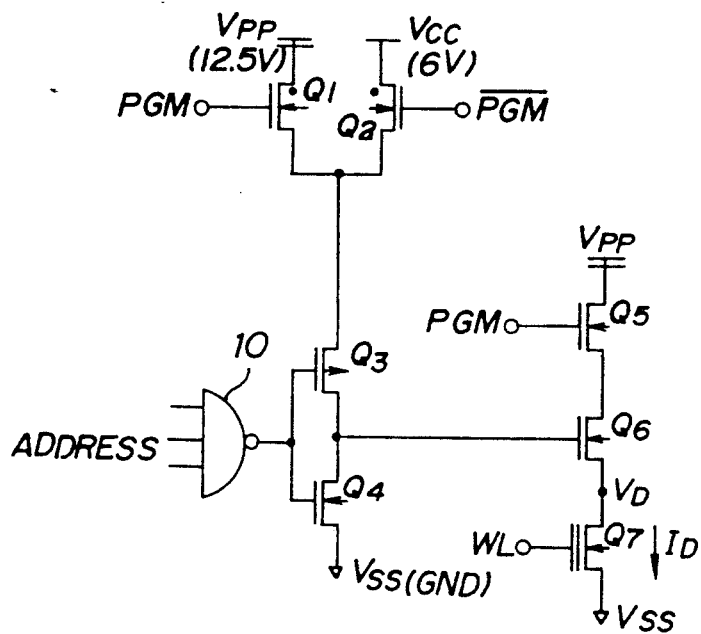
FIG. 1 is a circuit diagram showing an example of a conventional write circuit together with related parts of an EPROM.
Figure 2:
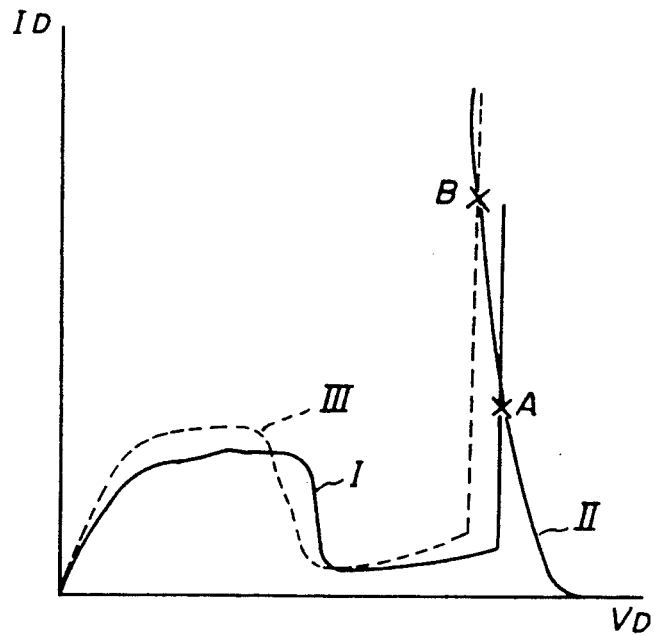
FIG. 2 is a graph illustrating breakdown characteristics of transistors of the conventional write circuit shown in FIG. 1.
Figure 4:
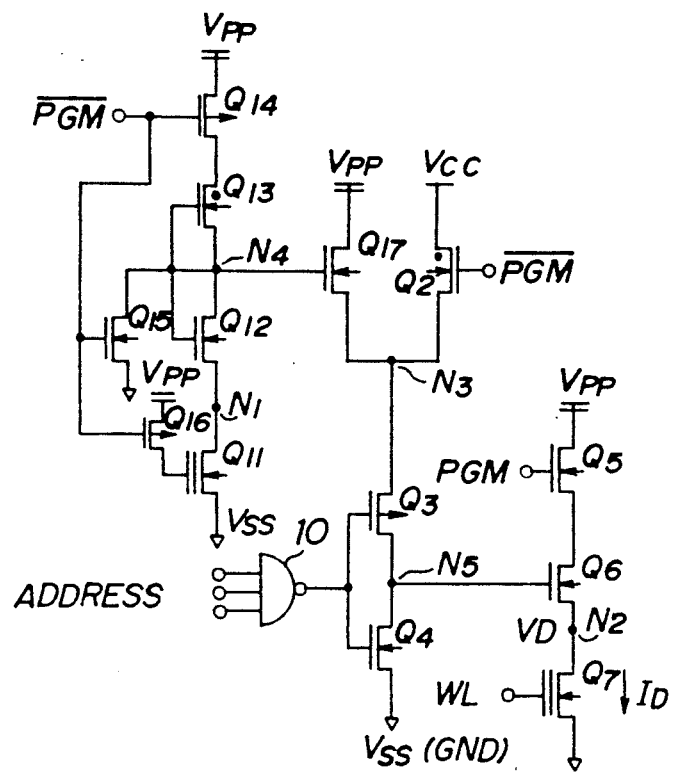
FIG. 4 is a circuit diagram of a first embodiment of the write circuit according to the present invention together with related parts of the EPROM.

FIG. 4 shows a first embodiment of the write circuit according to the present invention together with related parts of the EPROM shown in FIG. 3. In FIG. 4, those parts which are basically the same as those corresponding parts in FIG. 1 are designated by the same reference numerals, and a description thereof will be omitted.

In FIG. 4, the write circuit 55 includes transistors Q2 and Q11 through Q17. The NAND circuit 10 and the transistors Q3 through Q6 form a part of the column decoder 53. The cell transistor Q7 is connected to one word line WL and one bit line BL of the memory cell array 51.

The dummy cell transistor Q11 corresponds to the cell transistor Q7 and is used for obtaining a breakdown voltage. It is assumed that the dummy cell transistor Q11 has the same characteristics as the cell transistor Q7. The transistor Q12 corresponds to the bit line select transistor Q6. The depletion type transistor Q13 is used as a constant current source for determining the breakdown current. The transistors Q14 and Q16 are used for supplying a programming voltage Vpp, and the transistor Q15 is used to set a node N4 to a ground potential when no programming is occurring. The enhancement type transistor Q17 is used for supplying a power source voltage to the column decoder 53.

During a programming (write) mode in which the program signal $\overline{PGM}$ has a low level, the transistor Q15 turns OFF and the transistor Q14 turns ON, thereby supplying a programming voltage Vpp to the dummy cell transistor Q11. When the breakdown voltage of the dummy cell transistor Q11 is denoted b $V_B$ and the threshold voltage of the transistor Q12 is denoted by $V_{TH12}$, the potential at the node N4 can be described by $V_B + V_{TH12}$. Because the transistor Q3 is a p-channel transistor and the drain and source potentials thereof rise to a common voltage, the potential at a node N5 can be described by $V_B + V_{TH12} - V_{TH17}$, where $V_{TH17}$ denotes the threshold voltage of the transistor Q17.

Figure 5:
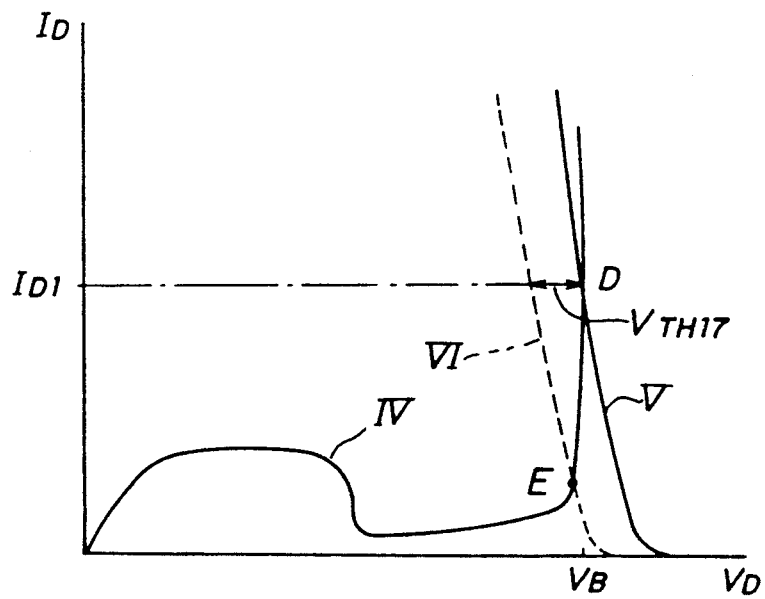
FIG. 5 is a graph illustrating breakdown characteristics of transistors of the write circuit shown in FIG. 4.

Accordingly, a load curve VI of the transistor Q6, indicated by a dotted line in FIG. 5, is obtained by intersecting a breakdown characteristic IV of the cell transistor Q7, indicated by a solid line, and a drain current $I_D$ versus drain voltage $V_D$ characteristic V of the transistor Q6, indicated by a solid line, at an intersection point D, that is, at a current $I_{D1}$ which is determined by the transistor Q13, and shifting the breakdown characteristic IV by the threshold voltage $V_{TH17}$ in the negative direction parallel to the $V_D$ axis in FIG. 5. When the breakdown current determined by the transistor Q13 is set to an optimum value of 500 μA or less, for example, it is possible to intersect the load curve VI and the breakdown characteristic IV at a point E which is in the vicinity of a rise (i.e., increase) of the breakdown current of the cell transistor Q7, thereby making it possible to realize a write operation with an optimum write efficiency even with only a minimum write current.

Even if the breakdown voltage of the cell transistor Q7 changes due to a change in the gate length caused by inconsistencies introduced from inevitable production error, the breakdown voltage $V_B$ of the dummy cell transistor Q11 undergoes a similar change, thereby to maintain the gate-source voltage of the select transistor Q6 approximately constant. As a result, the source current of the select transistor Q6, that is, the drain current $I_D$ of the cell transistor Q7, becomes approximately constant. In other words, the write operation is carried out under optimum conditions since the load curve VI of the transistor Q6 is shifted parallel to the VD axis in the same direction as the breakdown voltage of the transistor Q7. Accordingly, the write efficiency is improved, and it is possible to prevent breakdown of the cell transistor Q7 and the select transistor Q6 which otherwise would occur due to an excessively large current flow.

In this embodiment, the dummy cell transistor Q11 is a floating gate transistor. For this reason, the breakdown characteristic of the dummy cell transistor Q11 is different between an initial state in which no charge is accumulated in the floating gate of the dummy cell transistor Q11 and a state after two or more write operations in which a charge is accumulated in the floating gate of the dummy cell transistor Q11. In other words, the breakdown characteristic of the dummy cell transistor Q11 changes from that of the initial state, after two or more write operations. Hence, in order to stabilize the breakdown characteristic of the dummy cell transistor Q11, it is desirable to apply a programming voltage Vp to the dummy cell transistor Q11 before the actual write operation.

Figure 6:
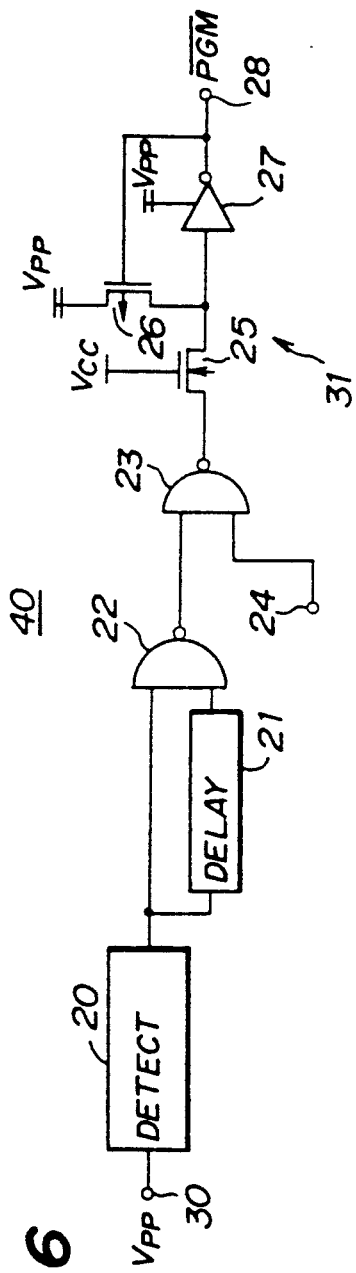
FIG. 6 is a circuit diagram of a detection circuit used in a modification of the first embodiment.

Next, a description will be given of a modification of the first embodiment, in which the program signal $\overline{PGM}$ is generated by a detection circuit 40 shown in FIG. 6, and which detects a rise of the programming voltage Vpp. In FIG. 6, a high voltage detection circuit 20 generates a high-level detection signal when the programming voltage Vpp is applied to a terminal 30 and detected by the high voltage detection circuit 20. This detection signal is supplied directly to a NAND circuit 22, on one hand, and is supplied to the NAND circuit 22 via a delay circuit 21, on the other hand. Hence, the NAND circuit 22 generates a signal which maintains a low level for a predetermined time after the programming voltage Vpp is applied to the terminal 30, where the predetermined time is dependent on the delay time of the delay circuit 21. The output signal of the NAND circuit 22 is supplied to a NAND circuit 23.

The NAND circuit 23 also receives an internal write signal from a terminal 24, and this internal write signal instructs the performance of a write operation by a low level thereof. The NAND circuit 23 obtains a sum (negative logic) of the two input signals and supplies an output signal thereof to a level conversion circuit 31 which is made up of transistors 25 and 26 and an inverter 27. High and low levels of the output signal of the NAND circuit 23 respectively are Vcc and 0 V, where Vcc denotes a power source voltage. Hence, the high-level output signal of the NAND circuit 23 is converted into the programming voltage Vpp in the level conversion circuit 31 and is output from a terminal 28 as the program signal $\overline{PGM}$. This program signal PGM is supplied to the transistors Q2, Q14, Q16 and the like shown in FIG. 4.

Figure 7:
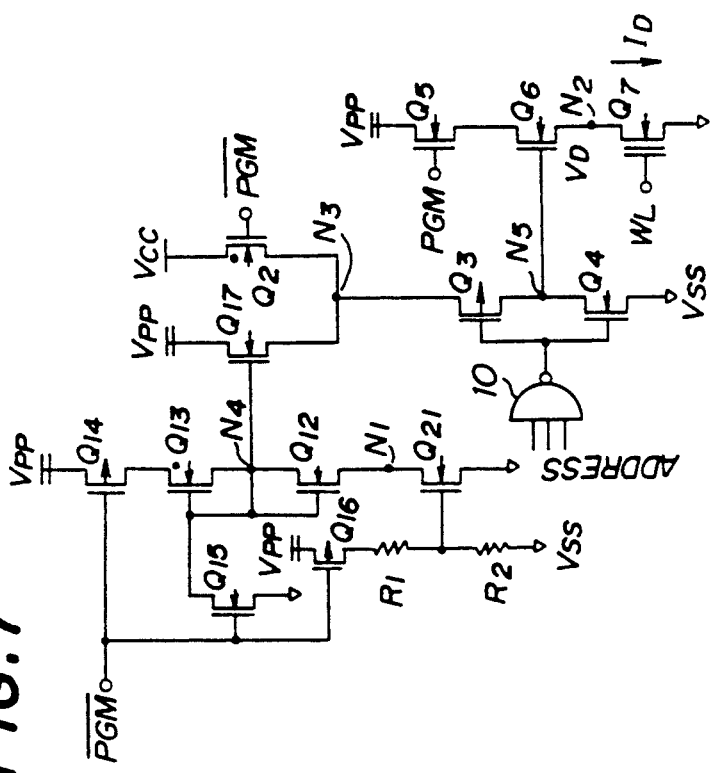
FIG. 7 is a circuit diagram of a second embodiment of the write circuit according to the present invention together with related parts of the EPROM.

Next, a description will be given of a second embodiment of the write circuit according to the present invention, by referring to FIG. 7. In FIG. 7, those parts which are the same as those corresponding parts in FIG. 4 are designated by the same reference numerals, and a description thereof will be omitted.

In this embodiment of FIG. 7, a single-layer gate transistor Q21 is used as the dummy cell transistor for detecting the breakdown voltage. In this case, a voltage which corresponds to a floating gate voltage in the programming mode is obtained by a voltage divider made up of resistors R1 and R2 and is applied to a gate electrode of the dummy cell transistor Q21. Even if the gate voltage actually changes slightly, the change in the breakdown voltage is small, and the voltage applied to the gate electrode of the dummy cell transistor Q21 need not be extremely accurate. For example, the voltage applied to the gate electrode of the dummy cell transistor Q21 may be in the range of 4 V to 5 V. In addition, since it is desirable that the structure of the dummy cell transistor Q21 be identical to that of the cell transistor Q7, it is preferable to use a floating gate (two-layer gate) transistor for the dummy cell transistor Q21 and to short-circuit the floating gate and the control gate of the floating gate transistor.

In the first and second embodiments respectively shown in FIGS. 4 and 7, the gate voltages of the dummy cell transistors Q11 and Q21 are applied only in the programming mode. For this reason, the electrical stress on the dummy cell transistors Q11 and Q21 can be minimized.

Further, the present invention is not limited to these embodiments, but various variations and modifications may be made without departing from the scope of the present invention.

What is claimed is:

1. A write circuit for a non-volatile memory device including a plurality of cell transistors, each of said cell transistors being connected to one of a plurality of bit lines, and a bit line select transistor provided with respect to each bit line and which supplies a source current thereof to one of the cell transistors, as a drain current of the cell transistor, via a corresponding one of the bit lines, said write circuit comprising:
   a dummy cell transistor which detects a breakdown voltage of the cell transistor in a write mode;
   circuit means, coupled to said dummy cell transistor and responsive to a write mode signal which is indicative of the write mode, for varying the gate voltage of the bit line select transistor as a function of the breakdown voltage detected by said dummy cell transistor and thereby to make the gate-source voltage of the bit line select transistor approximately constant, so that the drain current of the cell transistor during the write mode is maintained approximately constant; and
   the non-volatile memory device further comprising a row decoder connected to the word lines and which selects one of the word lines in response to an address signal, a column decoder connected to the bit lines and which selects one of the bit lines in response to the address signal, and a sense amplifier which senses and amplifies information read out from the cell transistors, said bit line select transistor being provided within said column decoder and said circuit means supplying a power source voltage for said column decoder.

2. The write circuit as claimed in claim 1, wherein said column decoder includes a NAND circuit which receives the address signal, an inverter circuit which inverts an output signal of said NAND circuit, the bit line select transistor having a gate which receives an output signal of said inverter circuit, and a write transistor coupled to said bit line select transistor and supplied with a write voltage, said write transistor being turned ON in response to the write mode signal in the write mode, and said cell transistor having a gate which is connected to a corresponding one of the word lines.

3. The write circuit as claimed in claim 2, which further comprises detection means for generating the write mode signal by detecting the rise of the write voltage.

4. The write circuit as claimed in claim 3, wherein each of said cell transistors and said dummy cell transistor is a floating gate transistor.

5. The write circuit as claimed in claim 1, wherein each of the cell transistors and said dummy cell transistor is a floating gate transistor.

6. A write circuit for a non-volatile memory device including a plurality of cell transistors, each of said cell transistors being connected to one of a plurality of bit lines, and a bit line select transistor provided with respect to each bit line and which supplies a source current thereof to one of the cell transistors, as a drain current of the cell transistor, via a corresponding one of the bit lines, said write circuit comprising:
   a dummy cell transistor which detects a breakdown voltage of the cell transistor in a write mode, each cell transistor comprising a floating gate transistor and said dummy cell transistor comprising a single-layer gate transistor; and
   circuit means, coupled to said dummy cell transistor and responsive to a write mode signal which is indicative of the write mode, for varying the gate voltage of the bit line select transistor as a function of the breakdown voltage detected by said dummy cell transistor and thereby to make the gate-source voltage of the bit line select transistor approximately constant, so that the drain current of the cell transistor during the write mode is maintained approximately constant.

7. A write circuit for a non-volatile memory device including a plurality of cell transistors, each of said cell transistors being connected to one of a plurality of bit lines, and a bit line select transistor provided with respect to each bit line and which supplies a source current thereof to one of the cell transistors, as a drain current of the cell transistors, via a corresponding one of the bit lines, said write circuit comprising:
   a dummy cell transistor which detects a breakdown voltage of the cell transistor in a write mode;
   circuit means, coupled to said dummy cell transistor and responsive to a write mode signal which is indicative of the write mode, for varying the gate voltage of the bit line select transistor as a function of the breakdown voltage detected by said dummy cell transistor and thereby to make the gate-source voltage of the bit line select transistor approximately constant, so that the drain current of the cell transistor during the write mode is maintained approximately constant; and
   detection means for generating the write mode signal by detecting a rise of the write voltage.

8. The write circuit as claimed in claim 2, wherein said dummy cell transistor has a structure identical to that of each cell transistor.

9. A write circuit for a non-volatile memory device including a plurality of cell transistors, each of said cell transistors being connected to one of a plurality of bit lines, and a bit line select transistor provided with respect to each bit line and which supplies a source current thereof to one of the cell transistors, as a drain current of the cell transistor, via a corresponding one of the bit lines, said write circuit comprising:
   a dummy cell transistor which detects a breakdown voltage of the cell transistor in a write mode; and circuit means, coupled to said dummy cell transistor and responsive to a write mode signal which is indicative of the write mode, for varying the gate voltage of the bit line select transistor as a function of the breakdown voltage detected by said dummy cell transistor and thereby to make the gate-source voltage of the bit line select transistor approximately constant, so that the drain current of the cell transistor during the write mode is maintained approximately constant, said circuit means varying the gate voltage of the bit line select transistor depending on the breakdown voltage detected by said cell transistor so that a breakdown of the cell transistor always occurs in an avalanche region.

10. The write circuit as claimed in claim 6, wherein each of the cell transistors and said dummy cell transistor is a floating gate transistor.

11. The write circuit as claimed in claim 6, wherein said dummy cell transistor has a structure identical to that of each cell transistor.

12. The write circuit as claimed in claim 7, wherein each of the cell transistors and said dummy cell transistor is a floating gate transistor.

13. The write circuit as claimed in claim 7, wherein said dummy cell transistor has a structure identical to that of each cell transistor.

14. The write circuit as claimed in claim 9, wherein each of the cell transistors and said dummy cell transistor is a floating gate transistor.

15. The write circuit as claimed in claim 9, wherein said dummy cell transistor has a structure identical to that of each cell transistor.

* * * * *

UNITED STATES PATENT AND TRADEMARK OFFICE
CERTIFICATE OF CORRECTION

PATENT NO. : 5,293,344
DATED : March 8, 1994
INVENTOR(S) : Takao AKAOGI

It is certified that error appears in the above-indentified patent and that said Letters Patent is hereby corrected as shown below:

On the Cover Page, [75] Inventor, change "Inagi" to --Tokyo--.

Col. 1, line 46, change "VD" to --$V_D$--;
line 64, after "Q7," insert --as intended,--.

Col. 3, line 35, change "b" to --by--.

Col. 4, line 57, change " $PGM$ " to -- $\overline{PGM}$ --.

Col. 6, line 56, change "claim 2" to --claim 1--.

Signed and Sealed this

Thirtieth Day of August, 1994

Attest:

BRUCE LEHMAN

Attesting Officer

Commissioner of Patents and Trademarks